(12) United States Patent
Beaucage et al.

(10) Patent No.: US 7,119,559 B2
(45) Date of Patent: Oct. 10, 2006

(54) VACUUM-ACTUATED TEST FIXTURE FOR TESTING PRINTED CIRCUIT BOARDS

(75) Inventors: Serge Beaucage, Delson (CA); Marco Deblois, St-Eustache (CA); Kim Mailhot, Montreal (CA)

(73) Assignee: Rematek Inc., St-Laurent (CA)

( * ) Notice: Subject to any disclaimer, the term of this patent is extended or adjusted under 35 U.S.C. 154(b) by 3 days.

(21) Appl. No.: 10/869,845

(22) Filed: Jun. 18, 2004

(65) Prior Publication Data

US 2004/0257097 A1    Dec. 23, 2004

Related U.S. Application Data

(60) Provisional application No. 60/479,468, filed on Jun. 19, 2003.

(51) Int. Cl.
*G01R 31/02* (2006.01)

(52) U.S. Cl. ..................................... 324/754
(58) Field of Classification Search ................ 324/754, 324/760–762, 765, 158.1
See application file for complete search history.

(56) References Cited

U.S. PATENT DOCUMENTS

| | | | |
|---|---|---|---|
| 4,138,186 A * | 2/1979 | Long et al. | 439/42 |
| 4,667,155 A * | 5/1987 | Coiner et al. | 324/754 |
| 5,200,694 A | 4/1993 | Nesbitt et al. | |
| 5,270,641 A * | 12/1993 | Van Loan et al. | 324/757 |
| 5,430,385 A | 7/1995 | Hutton et al. | |
| 5,894,225 A * | 4/1999 | Coffin | 324/762 |
| 6,005,405 A | 12/1999 | Slutz | |
| 6,054,869 A | 4/2000 | Hutton et al. | |
| 6,066,957 A | 5/2000 | Van Loan et al. | |

* cited by examiner

*Primary Examiner*—Minh Nhut Tang
*Assistant Examiner*—Tung X. Nguyen
(74) *Attorney, Agent, or Firm*—François Martineau (57) ABSTRACT

A test fixture for testing a circuit board, comprising a top plate defining a board-bearing surface for receiving the circuit board to be tested thereon. The test fixture comprises a lid having a lid frame defining a peripheral rim, and a lid diaphragm movably mounted to the frame opposite the peripheral rim; the lid diaphragm defines an inner surface to which is mounted a circuit board securing member. The lid is movable between a first position where the frame rim engages the top plate to define a test chamber about the board-bearing surface and between the top plate, the frame and the diaphragm, and a second position where the lid is moved away from the top plate to allow access to the test chamber. The lid diaphragm is movable relative to the frame at least when the lid is in the first position between a rest position where the securing member is moved away from the board-bearing surface and an operative position where the securing member is moved towards the board-bearing surface for engaging and securely holding the circuit board thereon. The test fixture further comprises a diaphragm biasing member continuously biasing the diaphragm towards the rest position, and an actuator, for selectively forcibly moving the diaphragm towards the operative position against the bias of the diaphragm biasing member. Moreover, the test fixture comprises at least one test probe projecting from either one of the lid and the top plate towards the board-bearing surface when the lid is in the first position and the diaphragm is in the operative position for allowing the at least one test probe to engage the circuit board. The test fixture also comprises a circuit interface for connecting the probes to a computer.

14 Claims, 7 Drawing Sheets

VACUUM-ACTUATED TEST FIXTURE FOR TESTING PRINTED CIRCUIT BOARDS

CROSS-REFERENCE DATA

The present application claims the priority under the Paris Convention of the co-pending Provisional Patent Application No. 60/479,468 filed Jun. 19, 2003.

FIELD OF THE INVENTION

The present invention relates to testing devices, and more particularly to a vacuum-actuated test fixture for testing printed circuit boards.

BACKGROUND OF THE INVENTION

Vacuum actuated test fixtures have been found to be highly effective for testing many types of printed circuit boards. Some of the heretofore available test fixtures of this type generally comprise a probe plate having a plurality of spring-loaded electrical probes thereon, and a casing supported above the probe plate and spaced away therefrom by a peripheral resiliently deformable seal. The casing includes a perforated top plate, the undersurface of which rests against the resilient seal and onto which a circuit board can be mounted. The probes of the probe plate can pass through the perforations of the top plate. The casing also includes a lid pivotally mounted to the upper surface of the top plate, which can be pivoted away from the top plate into an open position, and towards the top plate into a closed position. The lid comprises a peripheral lid frame and a lid plate fixedly attached to the top peripheral edge portion of the lid frame. Moreover, the lid plate comprises a number of downwardly projecting abutment fingers registering above the circuit board when the lid is closed. A peripheral resiliently deformable sealing member is attached to and depends downwardly from the lower rim of the lid frame, and rests against the top plate when the lid is closed.

To test a circuit board using such a test fixture, a circuit board is mounted on the top plate, the lid is set in its closed position with the lid's resilient sealing member sealing the inner chamber within the lid, and a vacuum is created between the top plate and the probe plate, and between the top plate and the lid. It is to be noted that when the lid is closed, but before a vacuum is created between the top plate and the lid, a substantial gap, typically of a few centimetres, separates the lid frame's lower rim and the top plate's upper surface, with the resilient sealing member filling this gap.

The creation of a vacuum between the top plate and the probe plate, and between the top plate and the lid, causes the following displacements to occur concomitantly:

the lid is drawn downwardly towards the top plate which movement is allowed by the sealing member resiliently yieldingly compressing to allow the lower rim of the lid frame to move towards the top plate's upper surface. As the lid is drawn towards the top plate, the abutment fingers projecting from the lid plate are moved downwardly in order to press the circuit board against the top plate, and thus secure the circuit board to the top plate; and the top plate is drawn downwardly towards the probe plate in order for the probes mounted on the probe plate ands extending through the perforations made across the top plate to abut against the undersurface of the printed circuit board to electrically connect the probes with corresponding predetermined circuits of the circuit board. When the probes come in contact with the circuit board, the probes apply upward pressure on the circuit board but the circuit board remains still since it is held down by the abutment fingers.

As useful as these test devices may be, their usage involve important security hazards. Indeed, it happens that an operator inadvertently places his finger(s) in the gap between the lower rim of the lid flame and the top plate, and then activates the vacuum pump to create a vacuum between the lid and the top plate. As the vacuum pump is activated, the lid is thrust downwardly against and crush the operator's misplaced finger(s), which can cause severe injuries.

Also, the above-mentioned prior art test devices also have some inaccuracy issues. Indeed, when the test fixture is made and assembled, there are often small undesirable plays that appear when the lid is installed on the top plate of the test fixture. This is at least partly due to the fact that the lid is designed to be pivotally movable relative to the top plate to allow access to the inner test chamber where the circuit board to be tested is installed, and consequently a high degree of precision is more difficult to achieve during the fabrication and assembly thereof. These undesirable plays may result in the lid slightly moving laterally when a vacuum is created therein, which results in turn in some lid-carried probes not engaging their corresponding contacts on the circuit board, among other problems related to this inaccuracy of the lid position.

SUMMARY OF THE INVENTION

The present invention relates to a test fixture for testing circuit boards, comprising:

a probe plate to which is mounted at least one test probe;

a top plate supported spacedly from and registering with said probe plate, said top plate defining at least one probe perforation made transversely thereon and through which said test probe can extend, said top plate further defining a board-bearing surface for receiving a circuit board thereon;

a lid having a lid frame defining a peripheral rim, said lid being movable between a first position where said lid frame peripheral rim sealingly engages said top plate about said board-bearing surface, and a second position where said lid is moved away from said top plate, said lid further comprising a lid diaphragm sealingly connected to said lid frame, said lid diaphragm being movable relative to said lid frame at least when said lid is in said first position between a rest position where said lid diaphragm is moved away from said top plate, and an operative position where said lid diaphragm is moved towards said top plate, said lid diaphragm defining an inner surface to which is mounted at least one circuit board securing member for engaging the circuit board when said lid is in said first position and said lid diaphragm is in said operative position;

a biasing member biasing said lid diaphragm towards said rest position and capable of yielding to allow said lid diaphragm to move towards said operative position;

a test chamber, enclosed by said top plate and said lid when said lid is in said first position;

at least one vacuum port in fluid communication with said test chamber, for connection to a vacuum pump which can be activated to create a vacuum within said test chamber; and a circuit interface for connecting said probes to data processing means;

wherein when said lid is in said first position and a vacuum is created in said test chamber, said lid diaphragm is moved towards said operative position against the bias of said biasing member for moving said circuit board securing member towards the circuit board to releasably secure the latter to said board-bearing surface.

In one embodiment, said biasing member includes a resilient diaphragm sealing strip between said lid frame and said lid diaphragm, said resilient diaphragm seal also providing a sealed interconnection between said lid diaphragm and said lid frame.

In one embodiment, an auxiliary seal is provided on said lid frame to enhance the sealed interconnection between said lid diaphragm and said lid frame when said lid diaphragm is in said operative position.

In one embodiment, said test fixture further includes a resilient probe plate seal spacing said top plate and said probe plate wherein a subchamber is enclosed by said probe plate, said resilient probe plate seal and said top plate, said subchamber being in fluid communication with said test chamber through an air passageway, and wherein upon creation of a vacuum in said test chamber, a vacuum is also created in said subchamber which causes said resilient probe plate seal to yield to allow said top plate to be moved towards said probe plate, for allowing said test probe to extend across said top plate through said probe perforation and come in electrical contact with the circuit board mounted on said top plate.

In one embodiment, said top plate includes a circuit board mounting member defining said board-bearing surface, with said circuit board securing member including an elongated finger affixed to and projecting from said lid diaphragm undersurface and destined to press the circuit board against said circuit board mounting member when said lid diaphragm is in said operative position.

In one embodiment, said test fixture further comprises at least another test probe affixed to said lid diaphragm, wherein a reading tip of said another test probe is destined to be brought in electrical contact with the circuit board when said lid diaphragm is moved towards said operative position.

In one embodiment, said test fixture further includes at least one guiding member projecting from said top plate towards said lid, said guiding member being sealingly and slidably engageable in a guide hole made in said diaphragm when said lid is in said first position, the displacement of said diaphragm between said rest and operative positions being defined along an axis of displacement and being guided by the slidable engagement of said guiding member in said diaphragm guide hole, said diaphragm being loosely carried by said frame so as to be at least slightly movable transversely relative to said axis of displacement for providing a self-aligning capacity to said diaphragm.

The present invention also relates to a test fixture for testing circuit boards, comprising:
a top plate, having at least one probe perforation made thereon for allowing at least one test probe to extend therethrough, said top plate comprising circuit board mounting means defining a movable board-bearing surface for receiving a circuit board thereon, said board-bearing surface destined to be movable relative to the at least one test probe;
a lid having a lid frame defining a peripheral rim, said lid being movable between a first position where said lid frame peripheral rim sealingly engages said top plate, and a second position where said lid is moved away from said top plate, said lid further comprising a lid diaphragm connected to said lid frame and defining an inner surface to which is mounted circuit board securing means, said lid diaphragm being movable relative to said lid frame at least when said lid is in said first position between a rest position where said circuit board securing means is moved away from said board-bearing surface, and an operative position where said circuit board securing means is moved towards said board-bearing surface for engaging the circuit board;
sealing means allowing a sealed interconnection between said lid diaphragm and said lid frame;
diaphragm biasing means biasing said lid diaphragm towards said rest position and capable of yielding to allow said lid diaphragm to move towards said operative position;
a test chamber, enclosed by said top plate and said lid when said lid is in said first position;
at least one vacuum port in fluid communication with said test chamber, for connection to a vacuum pump which can be activated to create a vacuum within said test chamber; and
circuit interface means for connecting said probes to data processing means;

wherein when said lid is in said first position and a vacuum is created in said test chamber, said lid diaphragm is moved towards said operative position against the bias of said biasing means for moving said circuit board securing means towards the circuit board to secure the latter to said board-bearing surface.

In one embodiment, said test fixture further includes a probe plate, and a resilient seal spacing said top plate and said probe plate, wherein a subchamber is enclosed by said probe plate, said resilient seal and said top plate, said subchamber being in fluid communication with said test chamber through an air passageway, and wherein upon creation of a vacuum in said test chamber, a vacuum is also created in said subchamber which causes said resilient seal to yield to allow said top plate to be moved towards said probe plate, for allowing said board-bearing surface and the at least one test probe to be moved towards one another for allowing the at least one test probe to come in electrical contact with the circuit board mounted on said board-bearing surface.

In one embodiment, said circuit board mounting means comprises:
a support plate defining said board-bearing surface, said support plate being mounted to said top plate spacedly and movably relative thereto, said support plate being movable relative to said top plate between a first position where said board-bearing surface of said circuit board mounting means is moved away from said top plate, and a second position where said board-bearing surface is moved towards said top plate for bringing the circuit board mounted thereon in electrical contact with the at least one test probe; and
support plate biasing means continuously biasing said support plate towards said first position, whereby when said lid diaphragm is moved towards said operative position, said circuit board securing means is moved towards said board-bearing surface for moving said support plate towards said second position against the bias of said support plate biasing means.

In one embodiment, said diaphragm defines an axis of displacement when it moves between said rest and operative positions, said text fixture further comprising guide means for guiding said diaphragm along said axis of displacement, said diaphragm being loosely carried by said frame so as to be at least slightly movable transversely relative to said axis of displacement for providing a self-aligning capacity to said diaphragm through said guide means.

The present invention further relates to a lid for use with a circuit board test fixture of the type having a top plate for mounting a circuit board thereon, said lid comprising:

a lid frame defining a peripheral rim for releasable engagement on the top plate:

a lid diaphragm carried by said lid frame opposite said peripheral rim, said lid diaphragm being movable relative to said lid frame between a rest position where said lid diaphragm is moved away from said peripheral rim, and an operative position where said lid diaphragm is moved towards said peripheral rim, said lid diaphragm defining an inner surface carrying at least one circuit board securing member for engaging the circuit board when said peripheral rim engages the top plate and when said lid diaphragm is in said operative position;

a biasing member biasing said lid diaphragm towards said rest position and capable of yielding to allow said lid diaphragm to move towards said operative position: and sealing means carried by either one of said frame, said lid diaphragm and both said lid frame and said lid diaphragm, for sealingly linking said lid frame to said lid diaphragm.

The present invention also relates to a test fixture for testing a circuit board, comprising:

a top plate comprising a circuit board-mounting member defining a board-bearing surface for receiving the circuit board to be tested thereon;

a lid comprising a lid frame defining a peripheral rim, said lid further comprising a lid diaphragm movably mounted to said frame opposite said peripheral rim, said lid diaphragm defining an inner surface to which is mounted a circuit board securing member, said lid being movable between a first position where said frame rim engages said top plate to define a test chamber about said board-bearing surface and between said top plate and said lid, and a second position where said lid is moved away from said top plate to allow access said board-bearing surface, said diaphragm being movable relative to said frame at least when said lid is in said first position between a rest position where said securing member is moved away from said board-bearing surface and an operative position where said securing member is moved towards said board-bearing surface for engaging and securely holding the circuit board thereon;

a diaphragm biasing member continuously biasing said diaphragm towards said rest position;

an actuator, for selectively forcibly moving said diaphragm towards said operative position against the bias of said diaphragm biasing member;

at least one test probe projecting from either one of said lid diaphragm and said top plate towards said board-bearing surface when said lid is in said first position and said diaphragm is in said operative position for allowing said at least one test probe to engage the circuit board; and a circuit interface, for connecting said at least one test probe to data processing means.

In one embodiment, said actuator comprises vacuum means in fluid communication with said test chamber for creating a vacuum within said test chamber, with said lid comprising a diaphragm seal sealingly linking said frame and said diaphragm and a frame seal sealingly linking said frame rim and said top plate when said lid is in said first position to seal said test chamber when said lid is in said first position.

In one embodiment, said test fixture further comprises:

a probe plate supported spacedly from and registering with said top plate opposite said lid when said lid is in said first position and carrying at least one probe plate test probe, said top plate comprising at least one probe perforation made transversely thereon with each said at least one probe plate test probe extending through a corresponding said probe perforation towards said board-bearing surface, said top plate being movable relative to said probe plate between a rest position away from said probe plate and an operative position where said top plate is moved towards said probe plate for allowing said at least one probe plate test probe to engage the circuit board through said top plate;

a probe plate seal sealingly linking said probe plate and said top plate and defining a subchamber between said probe plate and said top plate;

a top plate biasing member continuously biasing said top plate towards said rest position; and additional vacuum means for creating a vacuum in said subchamber;

wherein upon a vacuum being created in said test chamber and in said subchamber, there is a dual movement of said top plate towards said top plate operative position and of said diaphragm towards said diaphragm operative position for engaging each said test probe against the circuit board.

In one embodiment, the first-named said vacuum means and said additional vacuum means include a vacuum port connected to either one of said test chamber and subchamber for operative connection to a vacuum creating device, and an air passageway linking said test chamber and said subchamber.

In one embodiment, said diaphragm biasing member is less resistant than said top plate biasing member whereby said diaphragm will move from said diaphragm rest position towards said diaphragm operative position before said top plate biasing member moves from said top plate rest position towards said top plate operative position upon a vacuum being gradually and simultaneously created in said test chamber and said subchamber.

In one embodiment, said diaphragm seal and said diaphragm biasing member are a resiliently yieldingly deformable sealing strip linking said diaphragm to said frame.

In one embodiment, said diaphragm biasing member further includes at least one spring provided between said diaphragm and said frame and acting cooperatively with said resilient diaphragm sealing strip to bias said diaphragm towards said rest position.

In one embodiment, said probe plate seal and said top plate biasing member are a resiliently yieldingly deformable sealing strip linking said top plate to said probe plate.

In one embodiment, said lid further comprises an auxiliary sealing O-ring carried by either one of said frame and said diaphragm and sealingly linking said frame and said diaphragm when said diaphragm is in said operative position.

In one embodiment, said circuit board mounting member comprises:

a support plate defining said board-bearing surface, said support plate being mounted to said top plate spacedly and movably relative thereto, said support plate being movable relative to said top plate between a first position where said board-bearing surface of said circuit board mounting member is moved away from said top plate, and a second position where said board-bearing surface is moved towards said top plate for bringing the circuit board mounted thereon in electrical contact with said at least one test probe; and a support plate biasing member biasing said support plate towards its first position, whereby when said diaphragm is moved towards said operative position, said circuit board securing member is moved towards said board-bearing surface for moving said support plate towards said second position against the bias of said support plate biasing member.

In one embodiment, said diaphragm defines an axis of displacement when it moves between said rest and operative positions, said text fixture further comprising a first guiding member on said top plate and a second guiding member on said diaphragm cooperating with said first guiding member to guide said diaphragm along said axis of displacement, said diaphragm being loosely carried by said frame so as to be at least slightly movable transversely relative to said axis of displacement for providing a self-aligning capacity to said diaphragm through the cooperating first and second guiding members.

DETAILED DESCRIPTION OF THE EMBODIMENTS

FIGS. 1–4 show one embodiment of a vacuum-actuated test fixture 10 for testing printed circuit boards. Fixture 10 includes a probe plate 12 carrying a number of spring-loaded probes 14 of known construction, which, through the instrumentality of suitable circuit interface means such as suitable multi-pin plug 101, are electrically connected to a suitable data processing means such as a computer 100. Probes 14 extend through holes made in probe plate 12 and are affixed thereto, and the interconnection between probe plate 12 and probes 14 is made airtight by suitable sealing means. A vacuum port 16 is made in probe plate 12, and a nozzle 17 is fitted in vacuum port 16 which is intended to be connected to a vacuum pump 102. A peripheral resiliently deformable probe plate seal 18, made from a cross-sectionally rectangular strip of silicon-based foam for example (FIGS. 3–4), runs continuously and is affixed to the upper surface of probe plate 12, parallel to and slightly inwardly offset relative to the outer peripheral edge of probe plate 12. A leg member 24, having a shank portion 24a at one end of which a knob 24b is attached, is provided at each of the four corners of probe plate 12. The shank portion 24a of each leg member 24 extends transversely and slidably across probe plate 12, at the vicinity of one of its four corners. The free end of the shank portions 24a opposite knobs 24b is destined to engage corresponding apertures in a casing of an underlying circuit board data acquisition device (not shown) of known construction, which will carry the data processing means 100 and the vacuum pump 102.

Figure 7:
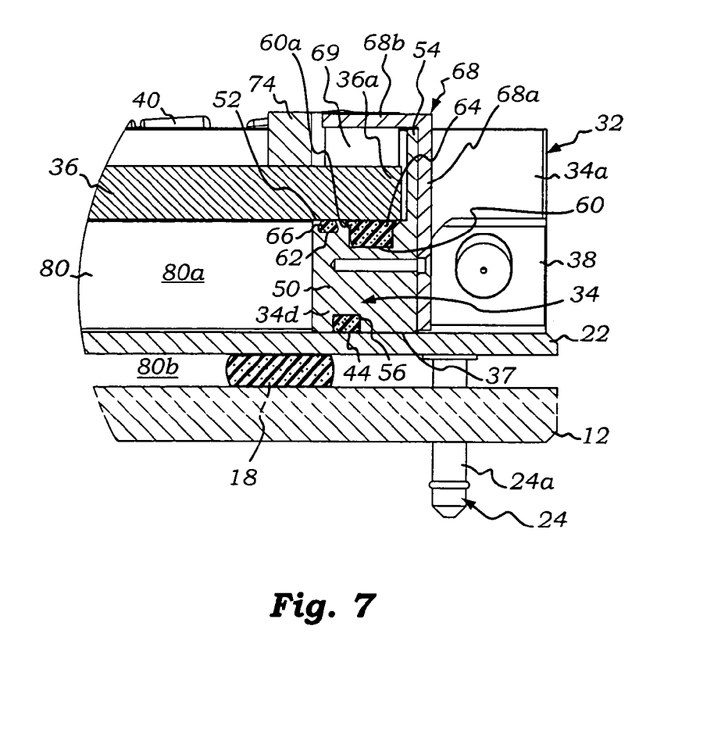
FIG. 7 shows an enlarged view of the area circumscribed within circle VII of FIG. 6.

A so-called top plate 22 is supported spacedly and movably above probe plate 12. The undersurface of top plate 22 rests against probe plate seal 18. Each corner of top plate 22 comprises a bore fixedly engaged by shank portion 24a of leg members 24 underneath knob 24b, probe plate 12 thus being slidably movable relative to top plate 22. Probe plate seal 18 spaces top plate 22 from probe plate 12, biases top plate 22 in a rest position away from probe plate 12, but as shown in FIG. 7, can yield and compress to allow top plate 22 to move downwardly towards probe plate 12 in an operative position, as detailed hereinafter. Furthermore, top plate 22 defines a number of perforations 23 each registering with a corresponding probe 14, and the reading tip 14a of probes 14 partly extends through perforations 23. At least one air passageway 25 is also made across top plate 22, for purposes detailed hereinafter. Moreover, a circuit board mounting means or member is provided on the upper surface of top plate 22, which includes positioning pins 26 and spacers 28. On one hand, positioning pins 26 are intended to engage complementary holes H, H made in a printed circuit board C (FIG. 1), to position the latter on top plate 22 such that circuit board C is precisely installed according to a predetermined position relative to and above perforations 23. On the other hand, spacers 28 are intended to support circuit board C slightly spaced above the upper surface of top plate 22; the plane shared by the free upper ends of spacers 28 thus forms a board-bearing surface of top plate 22. Of course, any other suitable circuit board mounting means could be envisioned to mount a circuit board on top plate 22; for example, a rectangular depression could be made in the upper surface of top plate 22, in which a circuit board to be tested could be snugly fitted.

Two elongated guide fingers 30 project upwardly and are affixed to the upper surface of top plate 22. In an alternate embodiment, fingers 30 could be affixed to probe plate 12 and extend through apertures made in top plate 22 to project beyond top plate 22.

Test fixture 10 further comprises a lid 32 pivotally attached to top plate 22 as described hereinafter. Lid 32 comprises a peripheral frame 34 defining a lower rim 37 and including side walls 34a, 34b and front and rear walls 34c, 34d respectively, within which a rigid lid diaphragm 36, in the form of a flat rigid wall, is movably mounted. Side walls 34a, 34b extend rearwardly beyond rear wall 34d, and are pivotally attached at their rear end to stationary pivot members 38, 38 affixed to the upper surface of top plate 22, to allow lid 32 to be pivotable relative to top plate 22 between an open position (FIG. 1) where the lid 22 is pivoted away from top plate 22, and a closed position where the lower rim 37 of lid frame 34 engages the upper surface of top plate 22 (FIGS. 2–7). Moreover, dampening hydraulic cylinders 40, 40 are attached at one end to lid frame side walls 34a, 34b respectively, and at the other end to flanges 42, 42 projecting upwardly from the upper surface of top plate 22. Cylinders 40, 40 are extracted when lid 32 is pivoted in its open position, and are retracted when lid 32 is pivoted in its closed position. Cylinders 40, 40 will dampen the movement of lid 32 between its open and closed positions, and can allow lid 32 to remain in its open position until forced towards its closed position.

Figure 4:
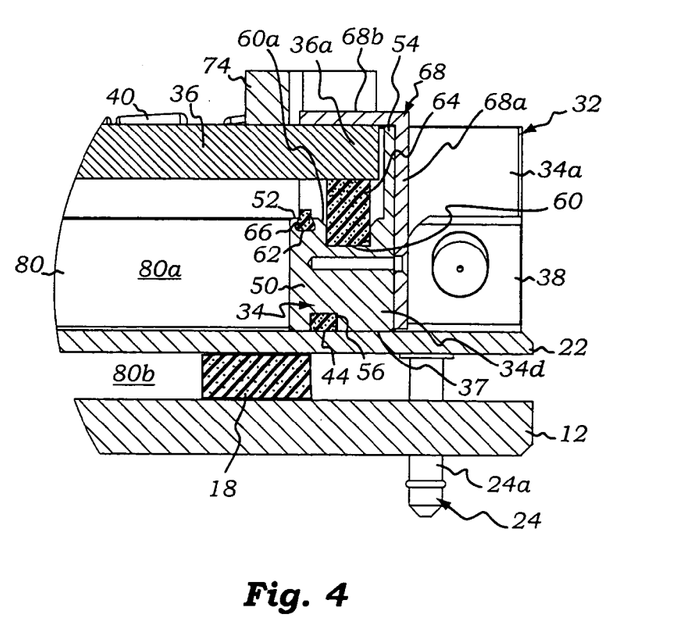
FIG. 4 shows an enlarged view of the area circumscribed within circle IV of FIG. 3.

The cross-sectional shape of lid frame walls 34a, 34b, 3c, 34d is best shown in FIG. 4. Each lid frame wall, for example wall 34d, comprises a relatively thicker base portion 50, the flat top surface of which will be further referred to as seat 52, and also comprises a relatively thin lip portion 54 upwardly projecting from seat 52, adjacent the outer edge thereof, and integrally to base portion 50.

A peripheral groove 56 is made lengthwisely along the undersurface of base portion 50 of all four lid frame walls 34a, 34b, 34c and 34d, and a continuous peripheral frame seal 44 is mounted coextensively therein. When lid 32 is closed, frame seal 44, made of a silicon-based foam for example, makes the mutual engagement of lid lower rim 37 and the upper surface of top plate 22 airtight. It is to be noted that when lid 32 is closed, lower rim 37 of lid 32 is applied directly on the upper surface of top plate 22, i.e. no gap, or a very small gap caused by the presence of frame seal 44, separates lower rim 37 and top plate 22. In any case, the interstice between lower rim 37 and top plate 22 is too narrow for an operator to slip his fingers therein when lid 32 is closed.

Two longitudinal grooves 60, 62 are made lengthwisely along seat 52 of all four lid frame walls 34a, 34b. 34c and 34d. The upper end of groove 60 is bevelled and broadened at 60a. Groove 60 provides accommodation for a continuous, cross-sectionally rectangular biasing diaphragm seal 64, which extends upwardly beyond seat 52. Diaphragm seal 64 runs continuously and coextensively along groove 60 of all four walls of lid frame 34. Diaphragm seal 64 is made from a resilient material; in one embodiment, the material forming diaphragm seal 64 is also compressible, and can be a silicon-based foam for example. Groove 62 is smaller than groove 60, and provides accommodation for an optional auxiliary seal in the form of a peripheral O-ring 66 running continuously and coextensively therein.

Lid 32 is also provided with a front handle 46 affixed to lid frame front wall 34c. A stopper plate 48 is secured atop handle 46 and extends beyond lip portion 54 of front lid frame wall 34c, such that it partly overhangs seat 52. Lid 32 is also provided with rear L-shaped brackets 68. Each bracket 68 integrally defines a vertical attachment portion 68a secured to the outer surface of lid frame rear wall 34d, and a horizontal stopper portion 68b extending beyond lip portion 54 of rear lid frame wall 34d and overhanging seat 52 of rear frame wall 34d.

As mentioned hereinabove, a rigid lid diaphragm 36, defining a peripheral edge portion 36a, is movably mounted to lid frame 34, within the boundaries of lip portions 54 of the four lid frame walls 34a, 34b, 34c, 34d. Lid diaphragm 36 can be made from a translucent and resistant material, such as rigid translucent plastic. Lid diaphragm 36 is mounted within the four lid frame walls 34a, 34b, 34c, 34d such that the undersurface of its peripheral edge portion 36a is supported on the free upper end of diaphragm seal 64. Resilient diaphragm seal 64 biases lid diaphragm 36 towards a rest position, away from seat 52, where the upper face of lid diaphragm edge portion 36a abuts against stopper plate 48 and stopper portions 68b, 68b of brackets 68, 68. Upon lid diaphragm 36 being forced downwardly, as described hereinafter, diaphragm seal 64 will resiliently yieldingly deform in a compressed state to allow lid diaphragm 36 to reach an operative position, where the undersurface of lid diaphragm edge portion 36a abuts against peripheral seat 52 of the four walls of lid frame 34.

Two seal-provided guide holes 70 are made transversely on lid diaphragm 36, and are disposed thereon such that they are sealingly and slidably penetrated by guide fingers 30 to guide the movement of diaphragm 36 between its rest and operative positions.

Figure 1:
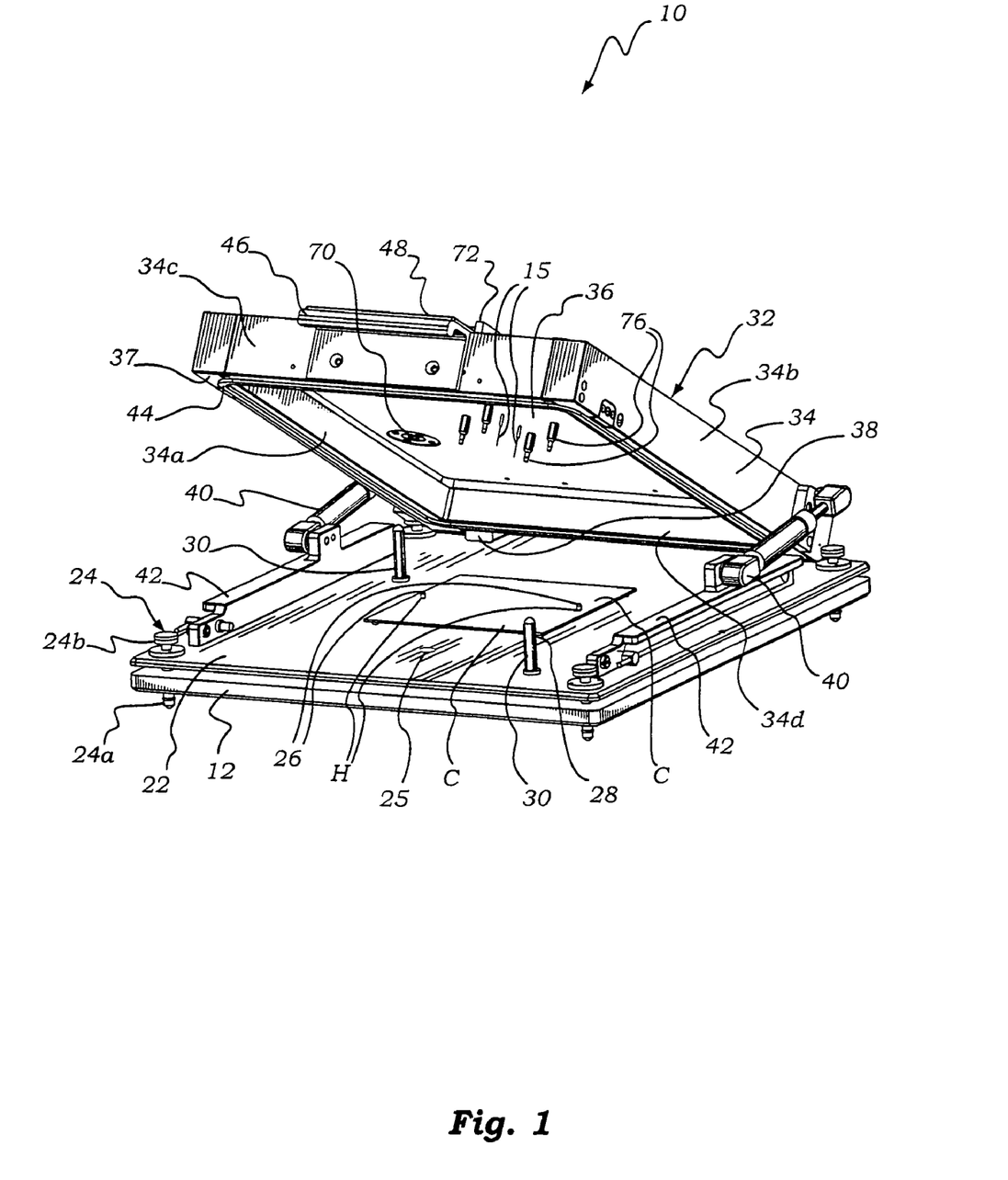
FIG. 1 shows a front perspective view of a vacuum-actuated test fixture according to one embodiment of the present invention, showing the lid of the fixture in an open position.
Figure 2:
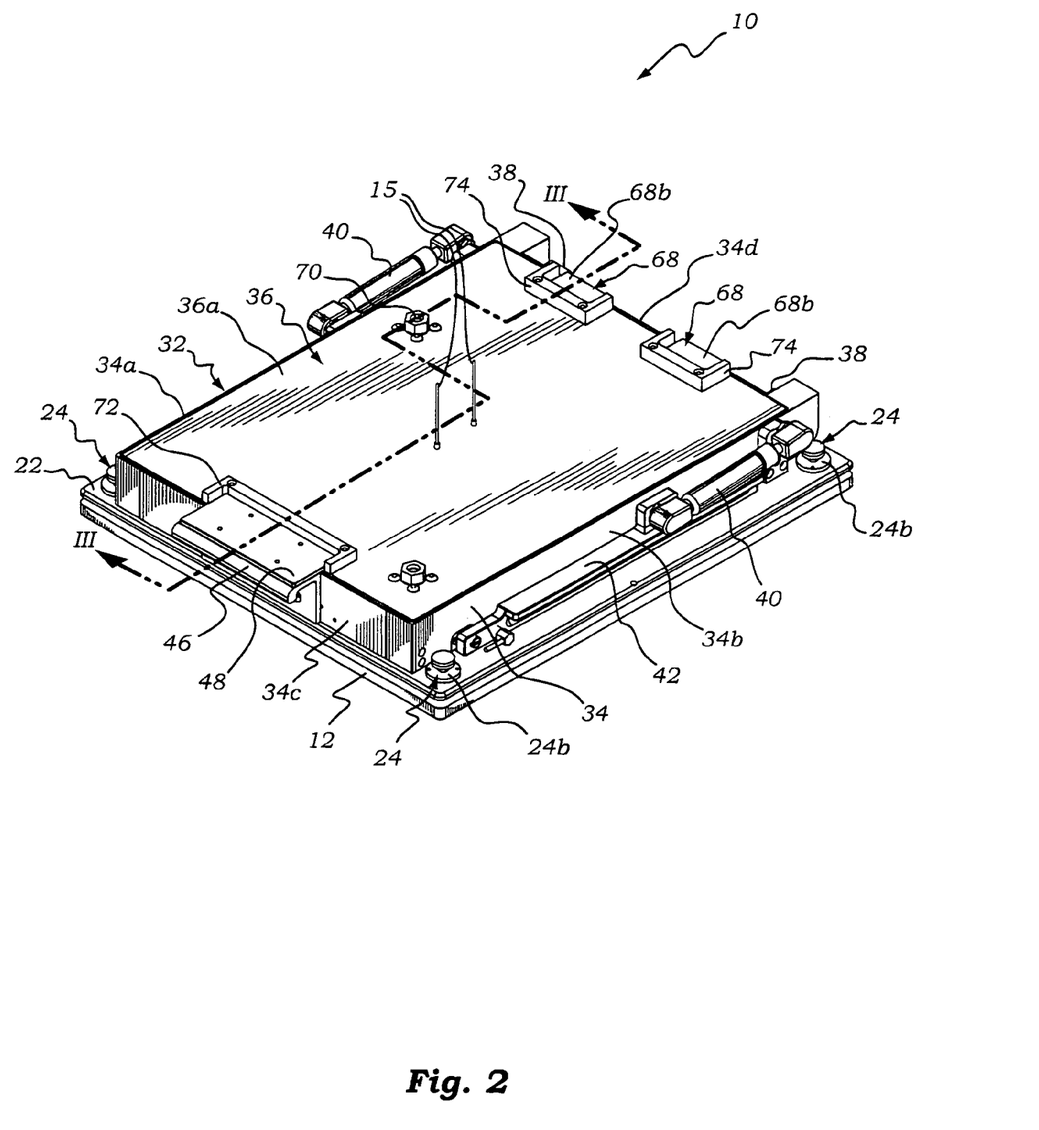
FIG. 2 shows a view similar to that of FIG. 1, but showing the lid in a closed position, and showing the lid diaphragm in its rest position.
Figure 5:
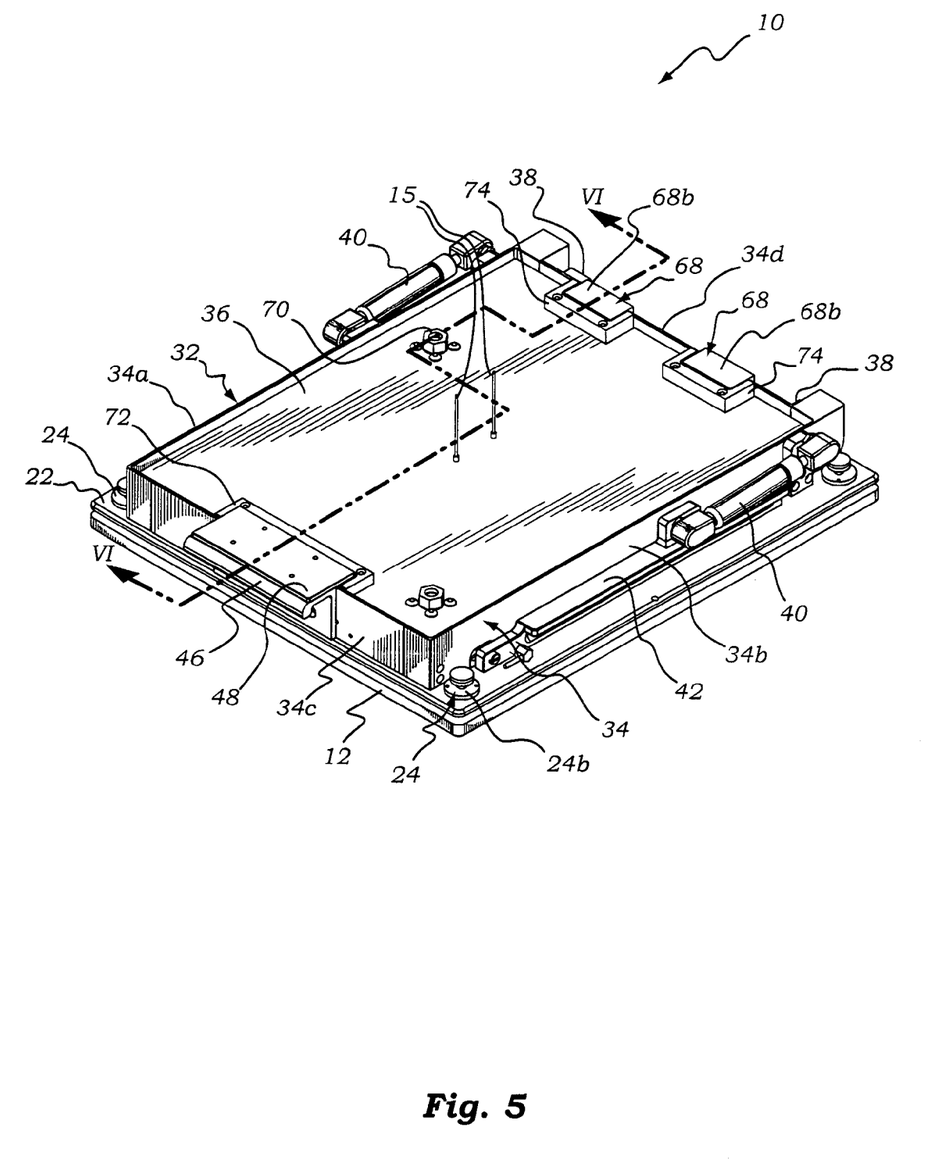
FIG. 5 shows a view similar to that of FIG. 2, but showing the lid diaphragm moved downwardly in its operative position.

Furthermore, three C-shaped, security ribs 72, 74, 74 are affixed to and upwardly project from the upper surface of lid diaphragm 36, as best shown in FIGS. 2 and 5. Rib 72 is arranged on lid diaphragm 36 so that it surrounds the front stopper plate 48, and ribs 74, 74 are arranged such that they surround rear bracket stopper portions 68b, 68b. When lid diaphragm 36 is in its lowered operative position, a substantially wide gap 69 (FIGS. 6–7) separates the upper surface of lid diaphragm 36 from stopper portions 68b, 68b and stopper plate 48; ribs 72, 74, 74 are intended to fence off these gaps 69 to prevent someone, e.g. an operator of the test fixture 10, to inadvertently place his fingers therein.

In the embodiment shown in the figures, a number of optional spring-loaded upper probes 15 defining a reading tip 15a and connected to suitable data processing means 100, extend across lid diaphragm 36 and are disposed thereon such that they overhang circuit board C when lid 32 is closed.

Furthermore, a number of circuit board securing members, in the form of abutment fingers 76, downwardly project from and are affixed to the undersurface of lid diaphragm 36, and are disposed to register above circuit board C when lid 32 is in its closed position. Fingers 76 are more particularly disposed to register, when lid 32 is closed, above regions of circuit C devoid of electrical components.

Figure 3:
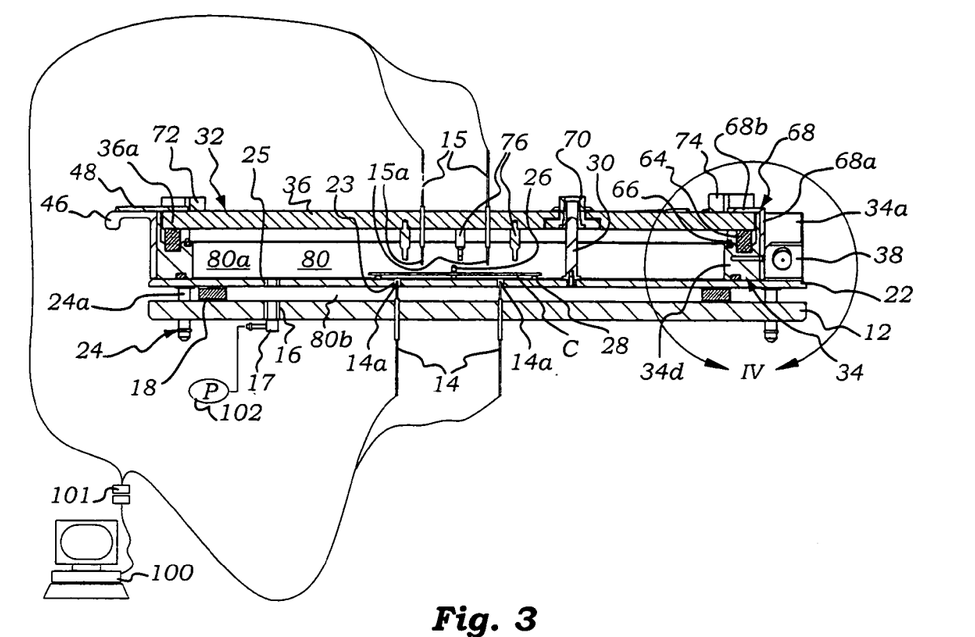
FIG. 3 shows a side cross-sectional view of the test fixture taken along line III—III of FIG. 1.

As best shown in FIG. 3, when lid 32 is closed, test fixture 10 defines a sealed inner chamber 80, which in turn defines two chambers: a test chamber 80a, enclosed by lid 32 and top plate 22, and a subchamber 80b, enclosed by probe plate 12, probe plate seal 18 and top plate 22. The two chambers 80a, 80b are in fluid communication with each other through probe apertures 16 (although the latter may optionally be sealed), and through air passageway 25 made in top plate 22 (although non-sealed probe apertures 16 may act as air passageways instead of passageway 25). When lid 32 is closed, inner chamber 80 is sealed from the atmosphere.

To test a circuit board C using test fixture 10, an operator has to pivot lid 32 away from top plate 22 in its open position (FIG. 1) to have access to test chamber 80a. A printed circuit board C is then laid onto top plate, such that it rests on spacers 28, and such that holes H, H of circuit board C engage positioning pins 26 to properly align circuit board C according to a precisely calculated predetermined position. Lid 32 is then pivoted back towards top plate 22 in its closed position, as shown in FIGS. 2–4, where frame seal 44 of lid frame 34 engages the upper surface of top plate 22 and where the free ends of guide fingers 30 slidably engage guide holes 70 in an airtight fashion. The vacuum pump 102 connected to vacuum nozzle 17 is then activated to create a vacuum within inner chamber 80.

Figure 6:
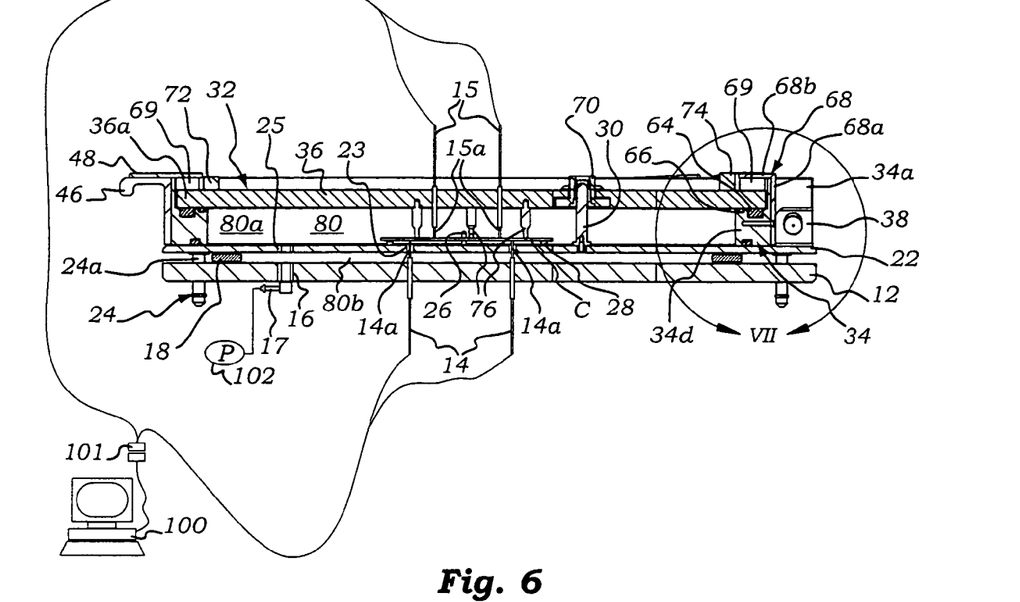
FIG. 6 shows a side cross-sectional view of the test fixture taken along line VI—VI of FIG. 5.

As vacuum pump 102 is activated, the pressure within inner chamber 80 drops, and a vacuum within inner chamber 80 is generated, and thus within both chambers 80a, 80b. As a vacuum within test chamber 80a is generated, as shown in FIGS. 5–7, lid diaphragm 36 is biased downwardly towards its operative position and towards top plate 32, and diaphragm seal 64 yields and deforms to allow lid diaphragm 36 to move towards its operative position, where its peripheral edge portion 36a rests on seat 52. In the embodiment where diaphragm seal 64 is made from a compressible material, when diaphragm seal 64 yields, it also compresses to fit entirely within the peripheral groove 60 and to fill the broadened portion 60a of groove 60 (FIGS. 6–7). As described above, to guide the motion of lid diaphragm 36 towards top plate 22, guide holes 70 of lid diaphragm 36 slide along guide fingers 30 projecting from top plate 22. When lid diaphragm 36 is moved in its operative position, infiltration of air from the atmosphere into test chamber 80a through the interface between lid diaphragm edge portion 36 and seat 52 is obviated by the combined sealing actions of both diaphragm seal 64 and the optional auxiliary O-ring 66. Furthermore, when lid diaphragm 36 is moved towards top plate 22, abutment fingers 76 apply a substantial downward force on the upper surface of circuit board C, thereby pressing the latter against spacers 28 and ensuring that holes H, H of circuit board C remain engaged on positioning pins 26. Thus, when a vacuum is generated in test chamber 80a, circuit board C becomes securely anchored to top plate 22 by the pressure applied by abutment fingers 76. Also, the passage of lid diaphragm 36 from its rest position to its operative position brings the reading tip 15a of optional upper probes 15 in electrical contact with registering predetermined corresponding electrical components present on the upper surface of circuit board C.

As the vacuum is concomitantly generated in chambers 80a, 80b, the downward vacuum-borne pressure that forces lid plate 36 downwardly will further be transferred through lid frame 34 onto top plate 22, the latter thus being biased downwardly. Probe plate seal 18 yields and compresses, as shown in FIGS. 6–7, to allow top plate 22 to relatively move towards probe plate 12 to reach its operative position, such relative movement being accomplished by the slidable engagement of probe plate 12 along leg member 24. As top plate 22 is drawn towards probe plate 12, the board-bearing surface and thus the printed circuit board C are moved towards probes 14 fixed to probe plate 12, and their reading tips 14a eventually come in electrical contact with registering predetermined corresponding electronic components located underneath circuit board C. When probes 14 come in contact with these components, they apply significant vacuum-borne upward pressure on circuit board C which biases the latter away from top plate 22, but circuit board C is nevertheless steadfastly held in place against the bias of probes 14 and prevented from disengaging the circuit board mounting means, i.e. positioning pins 26 and spacers 28, since the circuit board C is secured to top plate 22 by abutment fingers 76 and by optional lid probes 15.

In one embodiment, the relative resiliency of probe plate seal 18 and diaphragm seal 64 is calibrated to allow diaphragm seal 64 to collapse first under the vacuum being created in inner chamber 80. That is to say that diaphragm seal 64 will offer less resistance than probe plate seal 18 will. Consequently, diaphragm 36 will move downwardly towards its operative position before top plate 22 moves towards its own operative position when a vacuum is created. This will result in abutment fingers 76 abutting against circuit board C to securely hold it in place before the probe plate probes 14 apply any upward pressure against circuit board C.

Once the necessary electric data has been acquired by probes 14 and 15, and that this data has been analysed by the afferent data processing means 100, as known in the art, the test procedure is completed. The vacuum pump can then be deactivated, which causes inner chamber 80 to re-pressurize. As chambers 80a, 80b are re-pressurized, the biasing effect of resilient probe plate seal 18 is no longer overwhelmed by the pressure differential between the atmosphere and test chamber 80a. Accordingly, probe plate seal 18 springs back to its original configuration, top plate 22 is thus moved back to its rest position away from probe plate 12, and probes 14 are disconnected from circuit board C. Similarly, when chambers 80a, 80b are re-pressurized, diaphragm seal 64 can spring back to its original configuration, and lid diaphragm 36, along with probes 15 and abutment fingers 76, is moved back to its rest position. Lid 32 can then be opened, the tested circuit board C dismounted from the top plate, and another circuit board can be mounted on top plate 22 in order to be tested using the above-described test sequence.

The purpose of creating a vacuum in circuit board test fixtures such as test fixture 10 of the present invention, is to ensure that a proper connection will be established between the probe plate probes 14 and circuit board C. Indeed, considering that a very important number of probes 14 may have to be connected to circuit board C simultaneously, for example as many as several thousands of probes, a very significant pressure needs to be applied by the probes on the circuit board to ensure a proper connection of all probes 14. Use of a lid having an upper horizontal wall that is movable under the vacuum being created to apply a downward counter-pressure on the circuit board is thus highly desirable, to counteract the upward pressure of the probes. This will prevent the circuit board from being dislodged by the probes. The movable upper lid wall is also useful if lid probes 15 are also used, to properly connect the lid probes to the circuit board, although most circuit boards are tested with only probe plate probes 14.

One important advantage of the test fixture 10 according to the present invention over the prior art resides in the position of the lid deformable seal 64 that allows the lid top wall, which is in the form of a lid diaphragm 36 in the present invention, to move downwardly to apply the counteracting pressure on circuit board C.

Indeed, in prior art devices, the lid deformable seal is provided underneath the lid frame peripheral rim. This prior art deformable lid seal position results in the entire lid collapsing towards the top plate when a vacuum is created, including the lid frame. When test fixtures are used by a technician who is required to test an important number of circuit boards per hour, careless handling of the test fixture will often occur, which sometimes leads to the technician closing the lid too rapidly without having time to remove his fingers from underneath the lid after having placed a circuit board in the test fixture. With prior art test fixtures, injury results from such a situation when a vacuum is created before the technician has time to remove his fingers from underneath the lid frame: if the technician's fingers only very slightly protrude under the lid frame without reaching under the deformable seal, then the deformable seal is not prevented from properly sealing off the test fixture inner test chamber, and the frame is allowed to collapse under the vacuum being created to crush the technician's finger tips. Also, even if the technician's fingers protrude underneath the deformable seal of the test fixture lid, then upon the lid being closed over the technician's fingers, the deformable seal will deform around the technician's fingers and the lid will be allowed to reach, its closed, operative position, with the deformable seal substantially completely sealing off the test chamber, except in the immediate vicinity of the technician's fingers where only very small openings will exist. However, these small openings are not sufficient to prevent a vacuum from being created inside the inner chamber with sufficient negative pressure to bias the lid towards its downward operative position. Consequently, the technician's fingers stuck underneath the lid will effectively be crushed and possibly entirely cut off by the downwardly biased lid frame.

With the test fixture of the present invention, however, the lid's deformable seal 64 that allows diaphragm 36 to move downwardly against circuit board C to counteract the upward pressure of probes 14, is not positioned between the movable lid frame 34 and the top plate 22. Indeed, only a small flame seal 44 is located between frame 34 and top plate 22, with this small frame seal 44 having no significant deforming capacity, in that even when no vacuum is created within inner chamber 80, it is impossible for a technician to fit his fingers between the lid frame 34 and the top plate 22 when lid 32 is closed. The deformable diaphragm seal 64 is instead positioned between the lid frame 34 and the movable diaphragm 36, to allow diaphragm 36 to react under the effect of a vacuum inside inner chamber 80. Consequently frame 34 is not movable in any significant manner under the effect of a vacuum in inner chamber 80. This has the consequence of preventing a technician from placing his fingers between the lid frame 34 and the top plate 22 once the lid 32 is closed which could result in his finger tips being crushed, and it further and foremost has the advantage of preventing a vacuum from being created inside the inner chamber 80 if the technician closes lid 32 over his fingers: indeed, if the technician closes lid 32 while his fingers still protrude underneath the lid rim, then lid frame 34 will not reach its closed, operative position but will instead remain angularly opened over top plate 22 without engaging top plate 22 in the airtight relationship required for a vacuum to be created within inner chamber 80. Consequently, even if the vacuum pump 102 is activated when the lid 32 is closed over the technician's fingers, ambient air will be allowed to flow inside the inner chamber 80 and no vacuum will be created therein, thus effectively preventing injury to the technician who got his fingers stuck under the lid frame 34. Moreover, when the vacuum pump is deactivated and lid diaphragm 36 springs back to its rest position, an operator cannot get his fingers inadvertently crushed between lid diaphragm 36 and one of stopper plate 48 or stopper portions 68b, 68b, since this area is fenced off by security ribs 72, 74, 74.

It is noted that diaphragm 36 (as seen particularly in FIGS. 4 and 7) is slightly smaller than the area circumscribed by frame wall lip portion 54 so as to be loosely carried by frame 34. Thus, a small play exists between the outer peripheral edge of diaphragm 36 and the inner surface of frame wall lip portion 54, to allow a slight movement capacity of diaphragm 36 between frame wall lip portion 54. This slight movement capacity will allow diaphragm 36 to self-align when it engages guide fingers 30 with guide holes 70 so as to properly position the circuit board securing members 76 and the optional lid probes 15 above the circuit board C for their eventual engagement against circuit board C when diaphragm 36 moves towards its operative position. This self-aligning of diaphragm 36 will compensate undesirable fabrication and assembly errors that resulted in lid 32 not being properly positioned relative to top plate 22, and further positional errors resulting from the pivotal movement capacity of lid 32. This is also an important advantage over prior art devices. It is understood that alternate cooperating first and second guiding members provided respectively on the top plate and the diaphragm could be used for guiding the movement of the diaphragm towards the top plate, such as for example a guide pin integrally attached to the diaphragm and engaging guide holes provided on the top plate, or any other suitable guiding means.

Figure 8:
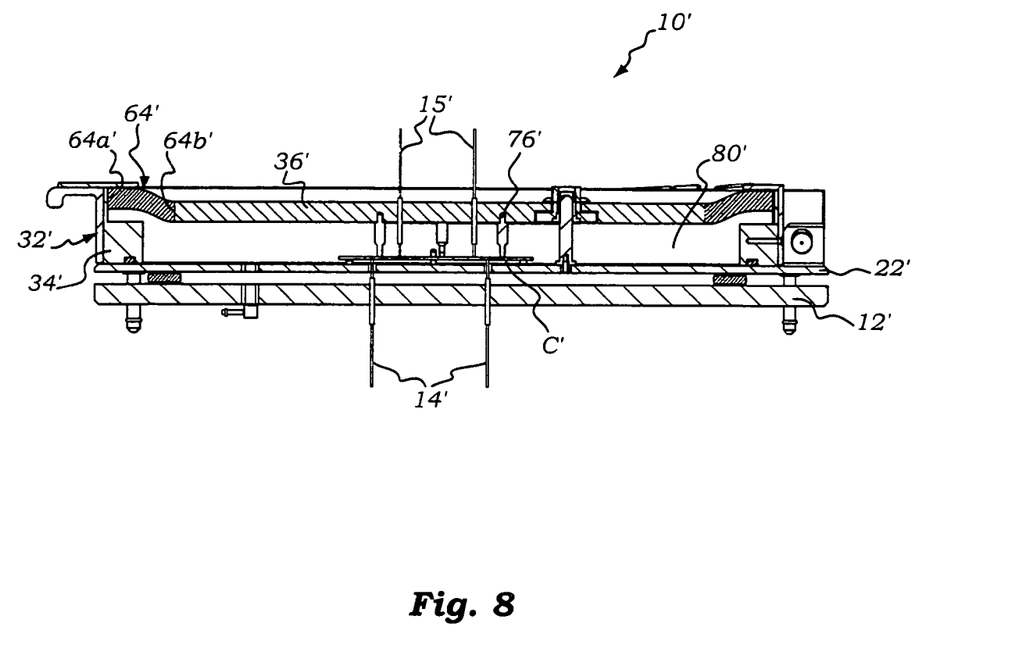
FIGS. 8 to 10 show side cross-sectional views of three respective alternate embodiments of the present invention.
Figure 9:
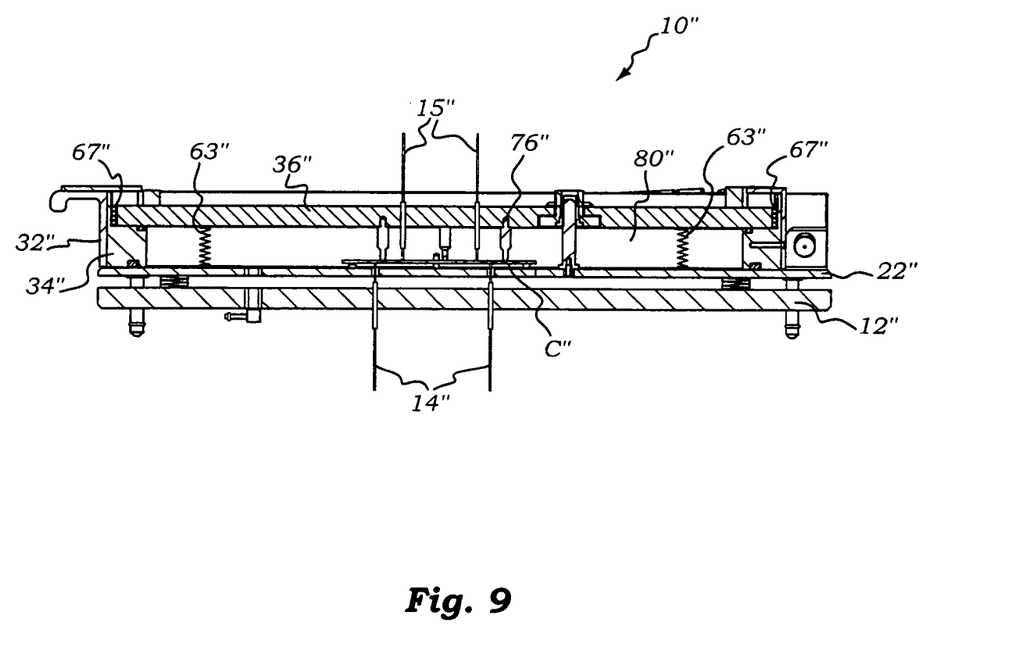
Figure 10:
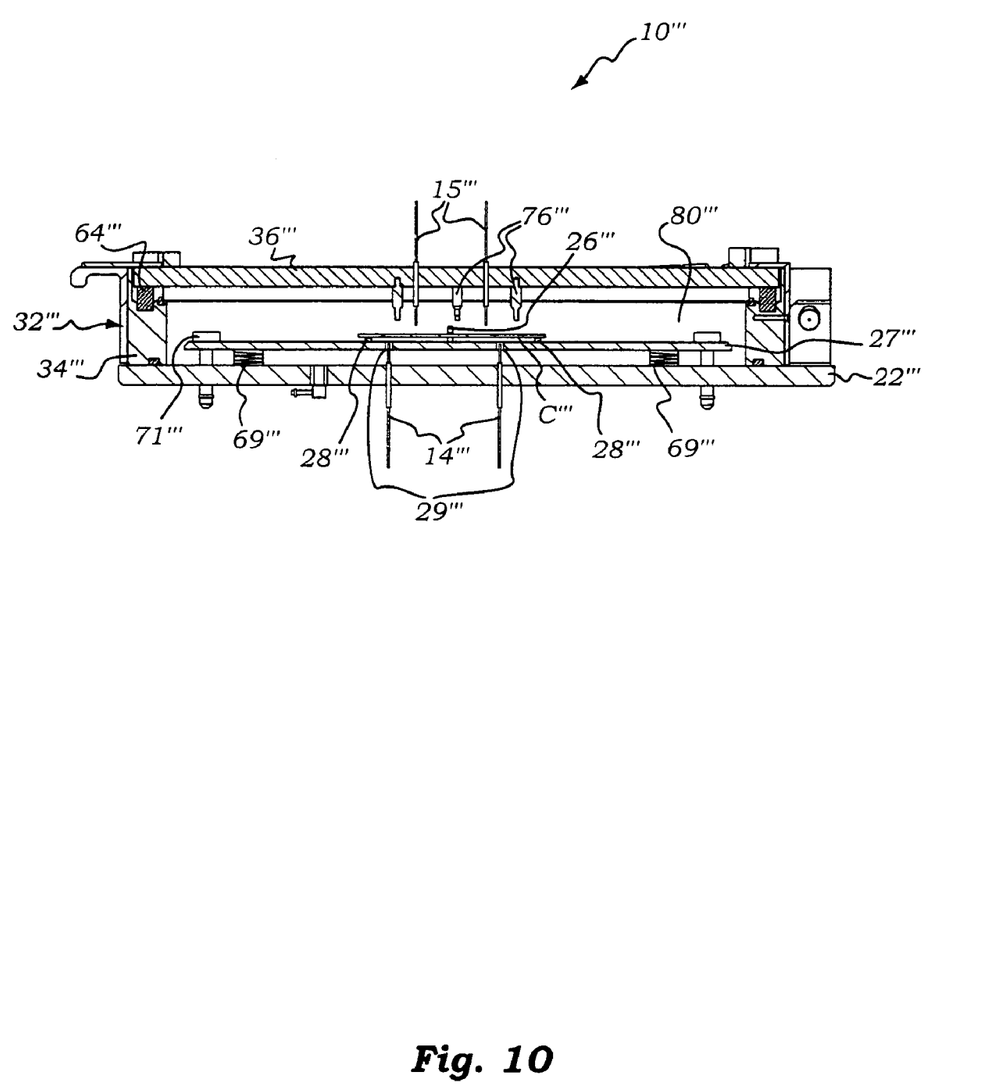

Alternate embodiments to the present invention could be envisioned. FIGS. 8–10 show examples of respective alternate embodiments to the present invention, where primed, double-primed, and triple-primed reference numbers refer to similar structures having the same non-primed reference numbers in the first embodiment shown in FIGS. 1–7.

FIG. 8 shows a fixture 10', comprising probe plate 12' having a number of probes 14' thereon, and a top plate 22' supported above probe plate 12' and on which a lid 32' is pivotally mounted. When lid 32' is closed, test fixture 10' defines a sealed inner chamber 80'. Lid 32' comprises a lid frame 34', to which the outer edge 64a' of a peripheral flexible resilient membrane 64' is attached. The resilient membrane 64', at its inner edge 64b', carries a rigid lid diaphragm 36' having abutment fingers 76' and optional upper probes 15' thereon. By generating a vacuum within inner chamber 80', top plate 22' is moved towards probe plate 12' so that probes 14' are brought in electrical contact with circuit board C'. Also, upon generation of this vacuum, membrane 64' is resiliently stretched in order for lid diaphragm 36' to move downwardly, for upper probes 15' to come in electrical contact with circuit board C', and for abutment fingers 76' affixed on the undersurface of lid diaphragm 36' to be pressed on the top surface of circuit board C'. Membrane 64' has the purpose of continuously biasing lid diaphragm 36' upwardly towards its upper rest position, of resiliently yielding to allow movement of rigid lid diaphragm 36' relative to circuit board C' between its rest and operative positions, and of allowing a sealed interconnection between lid frame 34' and lid diaphragm 36'.

FIG. 9 shows a fixture 10", comprising probe plate 12" having a number of probes 14" thereon, and a top plate 22" supported above probe plate 12" and on which a lid 32" is pivotally mounted. Lid 32" comprises a lid frame 34", movably carrying a rigid lid diaphragm 36", on the undersurface of which a number of abutment fingers 76', and spring-loaded biasing members 63" (e.g. springs), are affixed. A number of adjacent peripheral sealing members 67" ensure a sealed interconnection between lid frame 34" and lid diaphragm 36" at all positions of diaphragm 36". When lid 32" is closed, the free end of spring-loaded biasing member 63" abuts against top plate 22" to bias lid diaphragm 36" upwardly in a rest position. Also, when lid 32" is closed, fixture 10" defines a sealed inner chamber 80". By generating a vacuum within inner chamber 80", top plate 22" is moved towards probe plate 12" against the bias of biasing member 63" so that probes 14" are brought in electrical contact with circuit board C". Upon generation of this vacuum, biasing members 63" yield in order for lid diaphragm 36" to move downwardly, for upper probes 15" to come in electrical contact with circuit board C", and for abutment fingers 76" to be pressed on the top surface of circuit board C".

FIG. 10 shows a test fixture 10''', comprising a top plate 22''' having a number of probes 14''' fixedly extending therethrough, and having a circuit board mounting means or member. This circuit board mounting means comprises a number of guiding members 71''' affixed to and upwardly protruding from the upper surface of top plate 22''', and a support plate 27''' having through-holes slidably engaging guiding members 71''' so as to be slidably movable relative to top plate 22'''. Biasing means in the form of springs 69''' are interposed between the upper surface of top plate 22''' and the undersurface of support plate 27''', and continuously bias support plate 27''' upwardly away from top plate 22''' in a first position. Moreover, support plate 27''' comprises positioning pins 26''', for positioning a circuit board C''' on support plate 27''' such that circuit board C''' is precisely installed according to a predetermined position relative to and above perforations 29'''. Support plate 27''' also comprises spacers 28''' which are intended to support circuit board C''' slightly spaced above the upper surface of support plate 27'''; the plane shared by the free upper ends of spacers 28''' thus forms a board-bearing surface of support plate 27''', which is slidably movable relative to top plate 22'''.

A lid 32''' is pivotally mounted to top plate 22''', and is movable between an open and a closed position (shown in the closed position in FIG. 10). Lid 32''' comprises a peripheral lid frame 34''' defining a peripheral seat 52''', lid frame 34''' movably carrying a rigid lid diaphragm 36''' on the undersurface of which a number of abutment fingers 76''' are affixed. A number of optional upper lid probes 15''' sealingly extend through lid diaphragm 36'''. A resilient biasing diaphragm seal 64''' is attached to seat 52''' and biases lid diaphragm 36''' away from seat 52''' in a rest position.

When lid 32''' is closed, the lower peripheral rim of lid frame 34''' sealingly engages top plate 22''', and fixture 10''' defines a sealed inner chamber 80'''. By generating a vacuum within inner chamber 80''', lid diaphragm 36''' is moved in an operative position towards seat 52''' against the bias of diaphragm seal 64'''. As lid diaphragm 36''' is moved towards its operative position, upper probes 15''' are brought in electrical contact with corresponding electronic components on the upper surface of circuit board C'''. Also, abutment fingers 76''' are moved towards the circuit board C''' to exert a downward pressure thereon in order to secure the latter to support plate 27''', and to push support plate 27''' downwardly in a second position towards top plate 22''' against the bias of springs 69'''. As support plate 27''' is moved downwardly in its second position, the undersurface of circuit board C''' is brought in electrical contact with the tip of probes 14'''.

In yet another embodiment of the present invention (not shown), the test fixture comprises a board-bearing plate, and a movable lid having a lid frame and a lid diaphragm movably mounted to the lid frame and having upper probes sealingly extending therethrough. When the lid is closed, the peripheral rim of the lid frame directly engages the upper surface of a circuit board laid on a board-bearing surface of the board-bearing plate, to maintain the circuit board fixed about the board-bearing plate. Upon creation of a vacuum in the area enclosed by the circuit board, the lid frame and the diaphragm, the diaphragm moves towards the circuit board such that the upper probes are brought in electrical contact with the upper surface of the circuit board. In this embodiment, the only probes would thus be carried by the lid diaphragm.

In one embodiment, the probe plate and diaphragm seals 18, 64 are combined with springs (not shown) provided respectively between the probe plate and the top plate, and between the lid diaphragm and the lid frame, to increase the biasing effect of the biasing members formed by the combination of seals 18, 64 and the springs. The springs and seals 18, 64 would thus act cooperatively to bias the top plate relative to the probe plate, and the diaphragm relative to the lid frame.

Other alternate embodiments to the present invention could be envisioned where, instead of a vacuum pump, an alternate actuator is provided on the test fixture to actuate the top plate towards and away from the probe plate, and/or the lid diaphragm between its rest and operative positions. For example, a mechanical arm, or selectively magnetizable electromagnets, could be installed on the test fixture to actuate the top plate relative to the probe plate, and the lid diaphragm relative to the lid frame. Any other suitable actuating means could of course be provided on the test fixture.

Certain modifications and improvements could occur to skilled artisans upon a reading of the foregoing description. It should be understood that all such modifications and improvements have not been included herein for the sake of conciseness and readability but are properly within the scope of the following claims.

The invention claimed is:

1. A test fixture for testing circuit boards, comprising;
   a probe plate to which is mounted at least one test probe;
   a top plate supported spacedly from and registering with said probe plate, said top plate defining at least one probe perforation made transversely thereon and through which said test probe can extend, said top plate further defining a board-bearing surface for receiving a circuit board thereon:
   a lid having a lid frame defining a peripheral rim, said lid being movable between a first position where said lid frame peripheral rim sealingly engages said top plate about said board-bearing surface, and a second position where said lid is moved away from said top plate, said lid further comprising a lid diaphragm sealingly connected to said lid frame, said lid diaphragm being movable relative to said lid frame at least when said lid is in said first position between a rest position where said lid diaphragm is moved away from said top plate, and an operative position where said lid diaphragm is moved towards said top plate, said lid diaphragm defining an inner surface to which is mounted at least one circuit board securing member for engaging the circuit board when said lid is in said first position and said lid diaphragm is in said operative position;
   a biasing member biasing said lid diaphragm towards said rest position and capable of yielding to allow said lid diaphragm to move towards said operative position;
   a test chamber, enclosed by said top plate and said lid when said lid is in said first position:
   at least one vacuum port in fluid communication with said test chamber, for connection to a vacuum pump which can he activated to create a vacuum within said test chamber; and
   a circuit interface for connecting said probes to data processing means;
   wherein when said lid is in said first position and a vacuum is created in said test chamber, said lid diaphragm is moved towards said operative position against the bias of said biasing member for moving said circuit board securing member towards the circuit board to releasably secure the latter to said board-bearing surface.

2. The test fixture according to claim 1,
   wherein said biasing member includes a resilient diaphragm sealing strip between said lid frame and said lid diaphragm, said resilient diaphragm seal also providing a sealed interconnection between said lid diaphragm and said lid frame.

3. The test fixture according to claim 1,
   wherein an auxiliary seal is provided on said lid frame to enhance the sealed interconnection between said lid diaphragm and said lid frame when said lid diaphragm is in said operative position.

4. The test fixture according to claim 1,
   further including a resilient probe plate seal spacing said top plate and said probe plate wherein a subchamber is enclosed by said probe plate, said resilient probe plate seal and said top plate, said subchamber being in fluid communication with said test chamber through an air passageway, and wherein upon creation of a vacuum in said test chamber, a vacuum is also created in said subchamber which causes said resilient probe plate seal to yield to allow said top plate to be moved towards said probe plate, for allowing said test probe to extend across said top plate through said probe perforation and come in electrical contact with the circuit board mounted on said top plate.

5. The test fixture according to claim 1,
wherein said top plain includes a circuit board mounting member defining said board-bearing surface, with said circuit board securing member including an elongated finger affixed to and projecting from said lid diaphragm undersurface and destined to press the circuit board against said circuit board mounting member when said lid diaphragm is in said operative position.

6. The test fixture according to claim 1,
further comprising at least another test probe affixed to said lid diaphragm, wherein a reading tip of said another test probe is destined to be brought in electrical contact with the circuit board when said lid diaphragm is moved towards said operative position.

7. The test fixture according to claim 1,
further including at least one guiding member projecting from said top plate towards said lid, said guiding member being sealingly and slidably engageable in a guide hole made in said diaphragm when said lid is in said first position, the displacement of said diaphragm between said rest and operative positions being defined along an axis of displacement and being guided by the slidable engagement of said guiding member in said diaphragm guide hole, said diaphragm being loosely carried by said frame so as to be at least slightly movable transversely relative to said axis of displacement for providing a self-aligning capacity to said diaphragm.

8. A test fixture for testing circuit boards, comprising:
a top plate, having at least one probe perforation made thereon for allowing at least one test probe to extend therethrough, said top plate comprising circuit board mounting means defining a movable board-bearing surface for receiving a circuit board thereon, said board-bearing surface destined to be movable relative to the at least one test probe;
a lid having a lid frame defining a peripheral rim, said lid being movable between a first position where said lid frame peripheral rim sealingly engages said top plate, and a second position where said lid is moved away from said top plate, said lid further comprising a lid diaphragm connected to said lid frame and defining an inner surface to which is mounted circuit board securing means, said lid diaphragm being movable relative to said lid frame at least when said lid is in said first position between a rest position where said circuit board securing means is moved away from said board-bearing surface, and an operative position where said circuit board securing means is moved towards said board-bearing surface for engaging the circuit board;
sealing means allowing a sealed interconnection between said lid diaphragm and said lid frame;
diaphragm biasing means biasing said lid diaphragm towards said rest position and capable of yielding to allow said lid diaphragm to move towards said operative position;
a test chamber, enclosed by said top plate and said lid when said lid is in said first position:
at least one vacuum port in fluid communication with said test chamber, for connection to a vacuum pump which can be activated to create a vacuum within said test chamber; and
circuit interface means for connecting said probes to data processing means;
wherein when said lid is in said first position and a vacuum is created in said test chamber, said lid diaphragm is moved towards said operative position against the bias of said biasing means for moving said circuit board securing means towards the circuit board to secure the latter to said board-bearing surface.

9. The test fixture according to claim 8,
wherein said biasing means and said sealing means include a resilient diaphragm sealing strip affixed to said lid frame.

10. The test fixture according to claim 9,
wherein said biasing means further includes at least one spring provided between said diaphragm and said frame and acting cooperatively with said resilient diaphragm sealing strip.

11. The test fixture according to claim 8,
further including a probe plate, and a resilient seal spacing said top plate and said probe plate, wherein a subchamber is enclosed by said probe plate, said resilient seal and said top plate, said subchamber being in fluid communication with said test chamber through an air passageway, and wherein upon creation of a vacuum in said test chamber, a vacuum is also created in said subchamber which causes said resilient seal to yield to allow said top plate to be moved towards said probe plate, for allowing said board-bearing surface and the at least one test probe to be moved towards one another for allowing the at least one test probe to come in electrical contact with the circuit board mounted on said board-bearing surface.

12. The test fixture according to claim 8,
wherein said circuit board mounting means comprises:
a support plate defining said board-bearing surface, said support plate being mounted to said top plate spacedly and movably relative thereto, said support plate being movable relative to said top plate between a first position where said board-bearing surface of said circuit board mounting means is moved away from said top plate, and a second position where said board-bearing surface is moved towards said top plate for bringing the circuit board mounted thereon in electrical contact with the at least one test probe; and
support plate biasing means continuously biasing said support plate towards said first position, whereby when said lid diaphragm is moved towards said operative position, said circuit board securing means is moved towards said board-bearing surface for moving said support plate towards said second position against the bias of said support plate biasing means.

13. The test fixture according to claim 8,
wherein said diaphragm defines an axis of displacement when it moves between said rest and operative positions, said text fixture further comprising guide means for guiding said diaphragm along said axis of displacement, said diaphragm being loosely carried by said frame so as to be at least slightly movable transversely relative to said axis of displacement for providing a self-aligning captivity to said diaphragm through said guide means.

14. A lid for use with a circuit board test fixture of the type having a top plate for mounting a circuit board thereon, said lid comprising:

a lid frame defining a peripheral rim for releasable engagement on the top plate;

a lid diaphragm carried by said lid frame opposite said peripheral rim, said lid diaphragm being movable relative to said lid frame between a rest position where said lid diaphragm is moved away from said peripheral rim, and an operative position where said lid diaphragm is moved towards said peripheral rim, said lid diaphragm defining an inner surface carrying at least one circuit board securing member for engaging the circuit board when said peripheral rim engages the top plate and when said lid diaphragm is in said operative position;

a biasing member biasing said lid diaphragm towards said rest position and capable of yielding to allow said lid diaphragm to move towards said operative position; and sealing means allowing a sealed interconnection between said lid diaphragm and said lid frame;

wherein said diaphragm defines an axis of displacement when it moves between said rest and operative positions, said text fixture farther comprising a first guiding member on said top plate and a second guiding member on said diaphragm cooperating with said first guiding member to guide said diaphragm along said axis of displacement said diaphragm being loosely carried by said frame so as to be at least slightly movable transversely relative to said axis of displacement for providing a self-aligning capacity to said diaphragm through the cooperating first and second guiding members.

* * * * *